(12) United States Patent
Le Costaouec et al.

(10) Patent No.: US 10,619,274 B2
(45) Date of Patent: Apr. 14, 2020

(54) SYSTEMS AND METHODS FOR FORMING A COMPOSITE STRUCTURE

(71) Applicant: GOODRICH CORPORATION, Charlotte, NC (US)

(72) Inventors: Jean-Francois Le Costaouec, Pueblo West, CO (US); Paul Perea, Pueblo West, CO (US)

(73) Assignee: GOODRICH CORPORATION, Charlotte, NC (US)

( * ) Notice: Subject to any disclaimer, the term of this patent is extended or adjusted under 35 U.S.C. 154(b) by 0 days.

(21) Appl. No.: 16/239,271

(22) Filed: Jan. 3, 2019

(65) Prior Publication Data

US 2019/0136425 A1    May 9, 2019

Related U.S. Application Data

(62) Division of application No. 15/184,329, filed on Jun. 16, 2016, now Pat. No. 10,208,412.

(51) Int. Cl.

| | |
|---|---|
| *D04H 1/413* | (2012.01) |
| *D04H 1/4242* | (2012.01) |
| *D04H 1/736* | (2012.01) |
| *C04B 35/83* | (2006.01) |
| *C04B 41/00* | (2006.01) |

(Continued)

(52) U.S. Cl.
CPC ............ *D04H 1/413* (2013.01); *C04B 35/83* (2013.01); *C04B 41/009* (2013.01); *C04B 41/4554* (2013.01); *C04B 41/4584* (2013.01); *C23C 16/045* (2013.01); *D04H 1/4242* (2013.01); *D04H 1/46* (2013.01); *D04H 1/70* (2013.01); *D04H 1/736* (2013.01); *F16D 69/023* (2013.01);

(Continued)

(58) Field of Classification Search
None
See application file for complete search history.

(56) References Cited

U.S. PATENT DOCUMENTS

| | | | | |
|---|---|---|---|---|
| 3,378,235 A | * | 4/1968 | Udy .................. | B01F 15/00253 |
| | | | | 366/154.2 |
| 4,173,188 A | * | 11/1979 | Pearce ...................... | F23K 3/02 |
| | | | | 110/104 R |

(Continued)

FOREIGN PATENT DOCUMENTS

| | | |
|---|---|---|
| DE | 102010013710 | 10/2010 |
| EP | 2947191 | 11/2015 |
| WO | 2005037516 | 4/2005 |

OTHER PUBLICATIONS

European Patent Office, European Search Report dated Mar. 8, 2019 in Application No. 17176123.2.

(Continued)

*Primary Examiner* — Charles Capozzi

(74) *Attorney, Agent, or Firm* — Snell & Wilmer, L.L.P.

(57) ABSTRACT

The present disclosure provides systems and methods for forming a composite structure comprising rotating a base layer of an apparatus for forming the composite structure about an axis of rotation, transferring carbon short fibers from a first vibratory feed ramp onto the base layer in order to form a plurality of fibrous layers in the composite structure, and vibrating the first vibratory feed ramp during the transferring the carbon short fibers. The base layer may comprise an annular shape.

2 Claims, 9 Drawing Sheets

(51) Int. Cl.
*C04B 41/45* (2006.01)
*C23C 16/04* (2006.01)
*D04H 1/46* (2012.01)
*D04H 1/70* (2012.01)
*F16D 69/02* (2006.01)

(52) U.S. Cl.
CPC ............... *F16D 2200/0052* (2013.01); *F16D 2200/0065* (2013.01); *F16D 2200/0091* (2013.01)

(56) References Cited

U.S. PATENT DOCUMENTS

| | | | |
|---|---|---|---|
| 4,457,967 A * | 7/1984 | Chareire | C04B 35/83 188/251 A |
| 4,789,506 A * | 12/1988 | Kasprzyk | B28B 1/14 264/112 |
| 5,705,008 A | 1/1998 | Hecht | |
| 6,105,223 A | 8/2000 | Brown | |
| 6,421,884 B2 | 7/2002 | Pinto | |
| 6,855,428 B2 | 2/2005 | Lau et al. | |
| 7,198,739 B2 | 4/2007 | La Forest et al. | |
| 7,459,110 B2 | 12/2008 | Lenke et al. | |
| 2005/0172465 A1 | 8/2005 | Duval | |
| 2005/0266220 A1 | 12/2005 | La Forest | |
| 2012/0208419 A1 | 8/2012 | Dommes | |
| 2015/0337468 A1 | 11/2015 | Le Costaouec | |

OTHER PUBLICATIONS

EP Search Report dated Oct. 26, 2017 in EP Application No. 17176123.2.
Restriction Requirement dated Dec. 29, 2017 in U.S. Appl. No. 15/184,329.
Pre-Interview First Office Action filed Jun. 12, 2018 in. U.S. Appl. No. 15/184,329.
Notice of Allowance dated Oct. 24, 2018 in U.S. Appl. No. 15/184,329.
European Patent Office, European Search Report dated Oct. 26, 2017 in EP Application No. 17176123.2.
USPTO, Restriction Requirement dated Dec. 29, 2017 in U.S. Appl. No. 15/184,329.
USPTO, Pre-Interview First Office Action filed Jun. 12, 2018 in. U.S. Appl. No. 15/184,329.
USPTO, Notice of Allowance dated Oct. 24, 2018 in U.S. Appl. No. 15/184,329.
USPTO, Corrected Notice of Allowance dated Dec. 27, 2018 in U.S. Appl. No. 15/184,329.

* cited by examiner

SYSTEMS AND METHODS FOR FORMING A COMPOSITE STRUCTURE

CROSS REFERENCE TO RELATED APPLICATIONS

This application is a divisional of, and claims priority to and the benefit of, U.S. Ser. No. 15/184,329 filed Jun. 16, 2016 and entitled "SYSTEMS AND METHODS FOR FORMING A COMPOSITE STRUCTURE," which is hereby incorporated by reference in its entirety.

FIELD

This disclosure generally relates to forming composite structures, specifically by distributing carbon short fibers on a loom or rotating mold.

BACKGROUND

Composite structures are employed in various industries. Preparation of composite structures should be economical. Additionally, each layer of the composite structure should be precisely made in terms of fiber content and fiber distribution. An exemplary use for composite structures includes using them as friction disks such as aircraft brake disks, race car brake disks, clutch disks, and the like. Composite structure disks are especially useful in such applications because of the superior high temperature characteristics of composite material. In particular, the composite material used in composite structures is a good conductor of heat and thus is able to dissipate heat away from the braking surfaces that is generated in response to braking. Composite material is also highly resistant to heat damage, and is thus capable of sustaining friction between brake surfaces during severe braking, without a significant reduction in the friction coefficient or mechanical failure.

SUMMARY

In various embodiments, a method for making a composite structure may comprise rotating a base layer of an apparatus for forming the composite structure about an axis of rotation, transferring carbon short fibers from a first vibratory feed ramp onto the base layer in order to form a plurality of fibrous layers in the composite structure, and/or vibrating the first vibratory feed ramp during the transferring the carbon short fibers. The base layer may comprise an annular shape.

In various embodiments, the method may further comprise cutting a carbon fiber strand into the carbon short fibers, wherein the carbon short fibers may be between 0.5 inch and 2 inches in length, or between 0.75 inch and 1.5 inches in length. In various embodiments, the method may further comprise transferring the carbon short fibers from a first loader onto the first vibratory feed ramp, wherein the first loader comprises a loader hole comprising a first dimension and a second dimension, wherein the first dimension is larger than the second dimension, and the first dimension transfers the carbon short fibers to an outer edge of the first vibratory feed ramp. In various embodiments, the method may further comprise transferring additional carbon short fibers from a supplemental vibratory feed ramp onto an outer diameter area of the base layer. In various embodiments, the method may further comprise rolling the carbon short fibers with a roller in response to the transferring the carbon short fibers. In various embodiments, the method may further comprise compressing each of the plurality of fibrous layers during the rotating the base layer at a compression zone of the apparatus. The method may further comprise disposing an inner sacrificial edge along an inner diameter of the base layer and an outer sacrificial edge along an outer diameter of the base layer. The compressing the plurality of fibrous layers may comprise needling each of the plurality of fibrous layers during the rotating the base layer at the compression zone of the apparatus.

In various embodiments, the method may further comprise transferring a secondary material from a second vibratory feed ramp onto the base layer of the apparatus, and/or vibrating the second vibratory feed ramp during the transferring the secondary material. In various embodiments, the secondary material may comprise ceramic particles, powdery resin, carbon particles, and/or graphite particles. The transferring the carbon short fibers and the transferring the secondary material may occur simultaneously. In various embodiments, the method may further comprise densifying the carbon structure by chemical vapor infiltration, pre-ceramic polymer infiltration, and/or silicon melt infiltration.

In various embodiments, the base layer may be disposed within a cavity having an annular shape. The method may further comprise transferring a secondary material from a second vibratory feed ramp into the cavity and/or vibrating the second vibratory feed ramp during the transferring the secondary material. The secondary material may comprise ceramic particles, powdery resin, carbon particles, and/or graphite particles.

In various embodiments, the method may further comprise pretreating a carbon fiber strand to form an interface coating on the carbon fiber strand comprising at least one of pyrolytic carbon, boron nitride, or silicon carbide, wherein the carbon fiber strand is cut into the carbon short fibers. In various embodiments, the method may further comprise cutting a carbon fiber strand to form the carbon short fibers, wherein the carbon short fibers are between 0.5 inch and 2 inches long. In various embodiments, the method may further comprise compressing each of the plurality of fibrous layers during the rotating the base layer at a compression zone of the apparatus. In various embodiments, the method may further comprise densifying the carbon structure by at least one of chemical vapor infiltration, pre-ceramic polymer infiltration, or silicon melt infiltration.

In various embodiments, an apparatus for forming a composite structure may comprise a base layer that is annular in shape and configured to rotate about an axis of rotation, a vibratory feed ramp configured to transfer carbon short fibers to the base layer, and/or a vibration generator coupled to the vibratory feed ramp, wherein the vibration generator is configured to generate vibrations to vibrate the vibratory feed ramp.

BRIEF DESCRIPTION OF THE DRAWINGS

The present disclosure may be better understood with reference to the following drawing figures and description. Non-limiting and non-exhaustive descriptions are described with reference to the following drawing figures. The components in the figures are not necessarily to scale, emphasis instead being placed upon illustrating principles. In the figures, like referenced numerals may refer to like parts throughout the different figures unless otherwise specified.

DETAILED DESCRIPTION

All ranges may include the upper and lower values, and all ranges and ratio limits disclosed herein may be combined. It is to be understood that unless specifically stated otherwise, references to "a," "an," and/or "the" may include one or more than one and that reference to an item in the singular may also include the item in the plural.

The detailed description of various embodiments herein makes reference to the accompanying drawings, which show various embodiments by way of illustration. While these various embodiments are described in sufficient detail to enable those skilled in the art to practice the disclosure, it should be understood that other embodiments may be realized and that logical, chemical, and mechanical changes may be made without departing from the scope of the disclosure. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected, or the like may include permanent, removable, temporary, partial, full, and/or any other possible attachment option. Additionally, any reference to without contact (or similar phrases) may also include reduced contact or minimal contact.

In the context of the present disclosure, systems and methods may find particular use in connection with aircraft brake disks. However, various aspects of the disclosed embodiments may be adapted for optimized performance with a variety of carbon fiber preforms and carbon/carbon ("C/C") brake or clutch disks. As such, numerous applications of the present disclosure may be realized.

Carbon/carbon ("C/C") parts in the form of friction disks are commonly used for aircraft brake disks and race car brake and clutch disks. C/C brake disks are especially useful in these applications because of their relatively light weight and/or the superior high temperature characteristics of C/C material. In particular, the carbon/carbon material used in C/C parts is a good conductor of heat and is able to dissipate heat generated during braking away from the braking surfaces. Carbon/carbon material is also highly resistant to heat damage, and thus, is capable of sustaining friction between brake surfaces during severe braking without a significant reduction in the friction coefficient or mechanical failure. As used herein the term "composite structure" may be used to describe a carbon preform, a carbon fiber reinforced carbon material at various stages of densification, a carbon structure prior to densification and carbon reinforcement, and/or a finished carbon composite material.

Figure 1A:
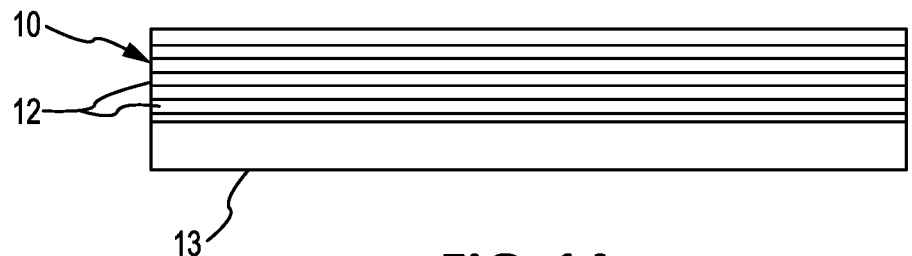
FIG. 1A illustrates a perspective view of a composite structure, in accordance with various embodiments.

Referring to FIG. 1A, a composite structure 10 is shown, in accordance with various embodiments. Composite structure 10 may be formed by superimposing a number of fibrous layers 12 on top of each other. In various embodiments, fibrous layers 12 may be made from carbon fibers, which may be oxidized polyacrylonitrile (PAN) fibers, which may be referred to as "OPF" fibers. In various embodiments, fibrous layers 12 may comprise one or more of OPF fibers, carbonized carbon fibers, phenolic based fibers, and/or pitched based fibers (collectively, "fibers"). Fibrous layers 12 may comprise one or more types of fibers.

Figure 1B:
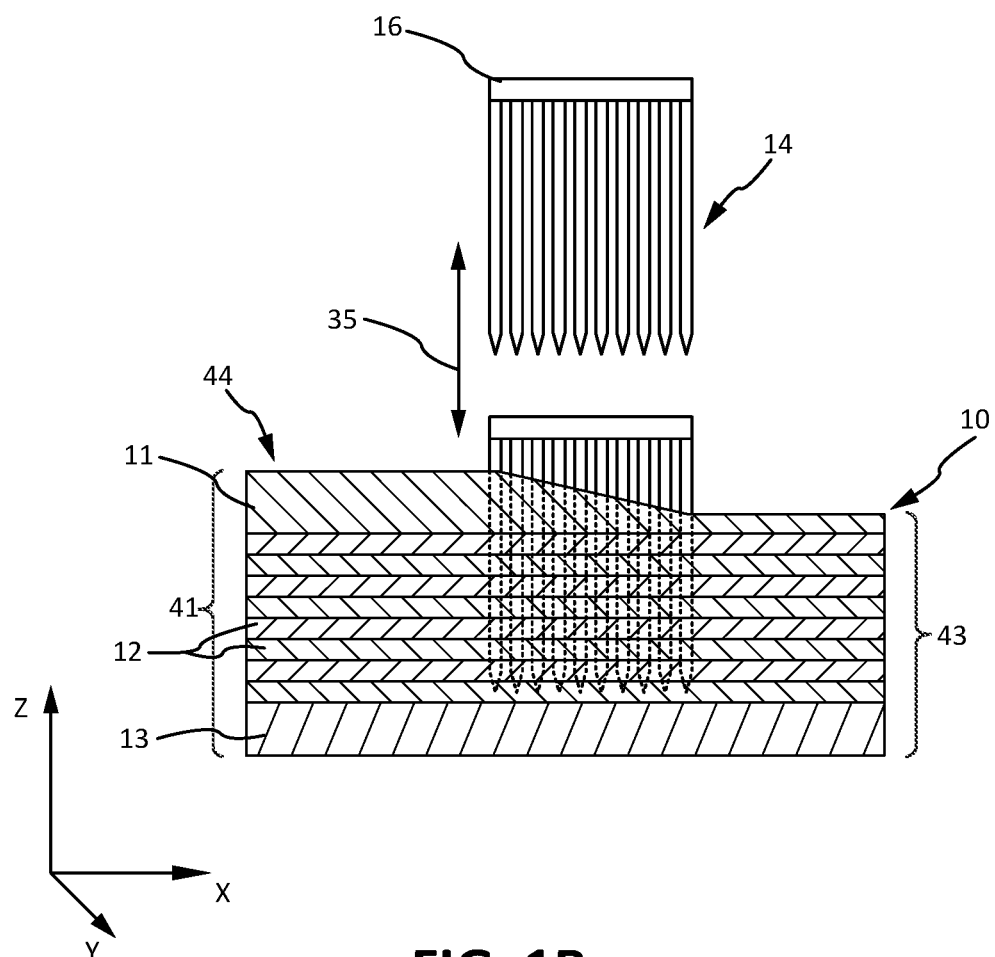
FIG. 1B illustrates a perspective view of a composite structure and compression board, in accordance with various embodiments.

With reference to FIGS. 1A and 1B, fibrous layers 12, or fibers comprised in fibrous layers 12, may be disposed on top of one another. Fibrous layers 12 may be stacked on a base layer 13, which may be a bed plate and/or a transport layer, as discussed herein. In response to a new fibrous layer 12 or new fibers being disposed on top of previous fibrous layers 12 or fibers, the stack 44 of fibrous layers 12 may be compressed by compression board 16. Compression board 16 may move up and down along axis 35 in a reciprocating manner, applying a compressive force to the fibers and/or fibrous layers 12. This compressive force may cause fibrous layers 12 to become more compact, and cause stack 44 to shorten from height 41 to compressed height 43. In various embodiments, compression board 16 may comprise one or more needles 14, which may apply a compressive force during the movement of compression board 16 along axis 35. The compressive force may compress a newly-added fibrous layer 11 as shown in FIG. 1B, while compressing the entire stack 44. In embodiments in which compression board comprises needles 14, barbed needles may create z-fibers and stitch stack 44 together along the z axis, thereby causing stack 44 to maintain the compressed height 43. In response to the compressive force being applied by needles 14, the horizontal fibers (in the x and y directions) are interconnected with a third direction (also called the z-direction). The fibers extending into the third direction are also called z-fibers. Thus, after needling, composite structure 10 has fibers extending in three different directions (i.e., in the x and y directions in the plane of the fibrous layers 12 and the z direction perpendicular to the fibrous layers 12).

As used herein, "compressive force", "compress", or the like by a compression board, such as compression board 16, may refer to the compressing of fibrous layers by the compression board, in embodiments in which the compression board does not comprise needles 14. As used herein, in embodiments in which a compression board, such as compression board 16, comprises one or more needles 14, "compressive force", "compress", or the like by the compression board may refer to the penetrating of needles 14 into the fibrous layer(s) 12, which may or may not compress stack 44. As used herein, the terms "tow" and "cable" are used to refer to one or more strands of substantially continuous filaments. Thus, a "tow" or "cable" may refer to a plurality of carbon fiber strands of substantially continuous filaments or a single strand of substantially continuous filament. A "textile" may be referred to as a "fabric" or a "tape." As used herein, the unit "K" represents "thousand." Thus, a 1K tow means a tow comprising about 1,000 strands of substantially continuous filaments. Fewer or greater amounts of textile fibers may be used per cable in various embodiments. In various embodiments disclosed herein, fabrics in accordance with various embodiments may comprise tows of from 0.1K to about 100K, or from about 12K to about 100K, and, in various embodiments, heavier tows comprising about 300K to about 320K. As used in this context only, the term "about" means plus or minus 5K.

Figure 2A:
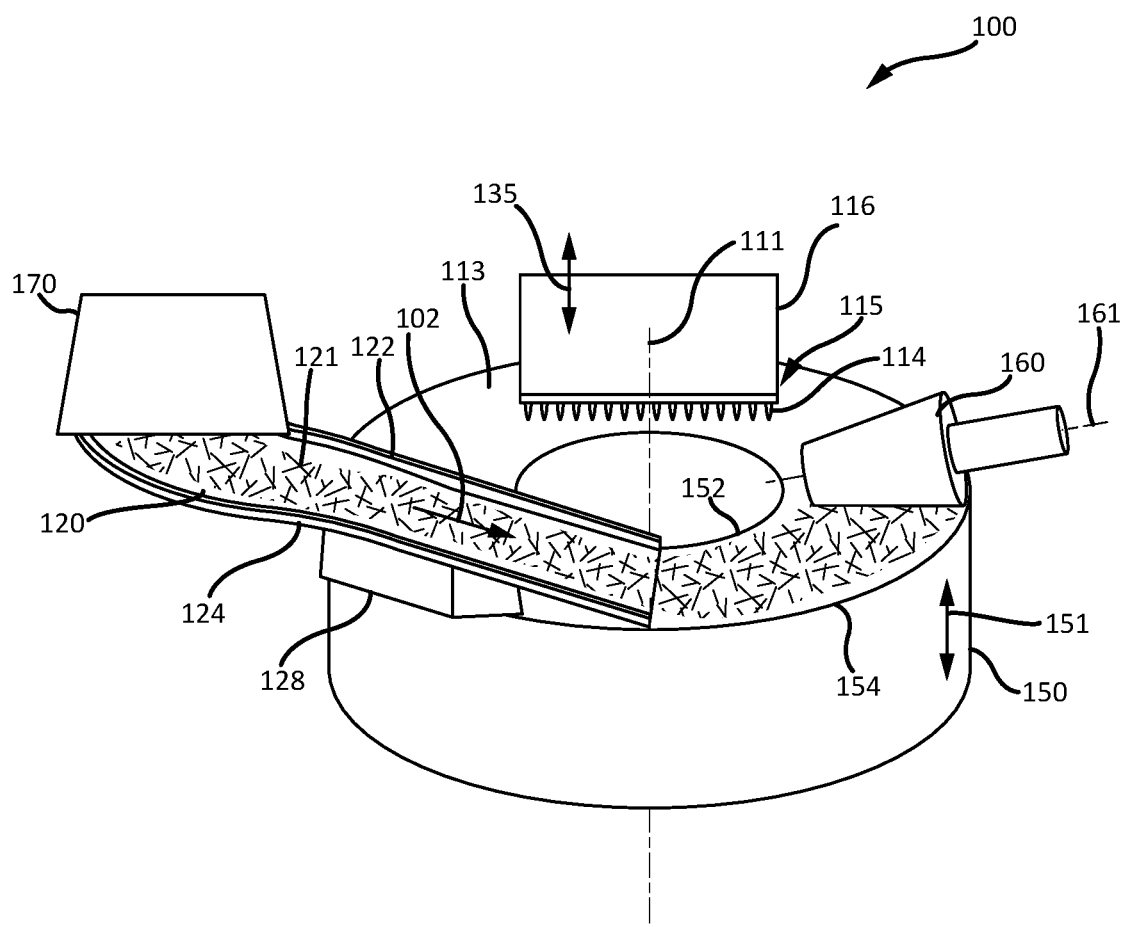
FIG. 2A illustrates a perspective view of a loom system with a vibratory feed ramp, in accordance with various embodiments.
Figure 2B:
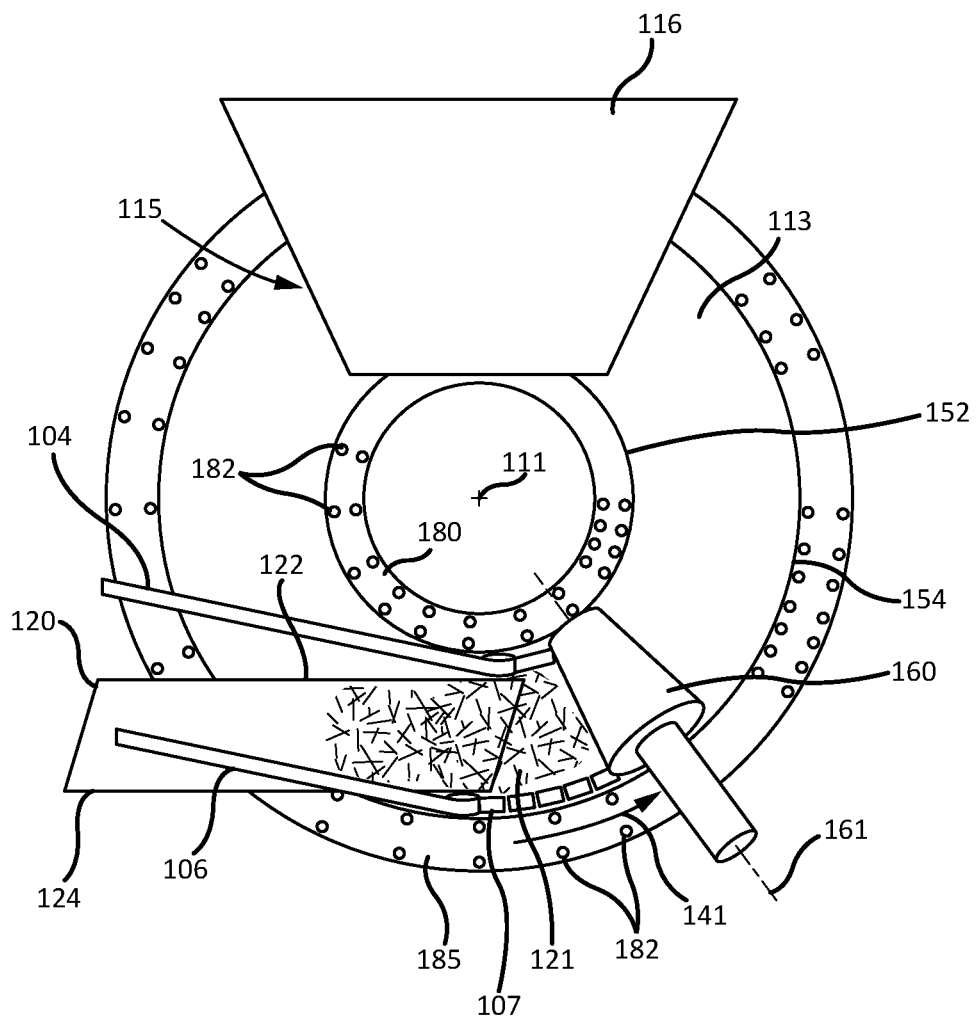
FIG. 2B illustrates a top view of a loom system, in accordance with various embodiments.

Referring to FIGS. 2A and 2B, in accordance with various embodiments, an apparatus for forming a composite structure is depicted. With combined reference to FIGS. 1B, 2A, and 2B, the apparatus for forming a composite structure may be a loom system 100. Elements with the like element numbering between figures are intended to be the same and will not be repeated for the sake of clarity. In various embodiments, loom system 100 may comprise a loom 150. Loom 150 may have an annular shape such that composite structures formed in loom 150 are the annular shape of brake disks. Loom system 100 may comprise a base layer 113 upon which carbon short fibers 121 may be disposed. In various embodiments, base layer 113 may be a bed plate and/or a transport layer. The transport layer may be disposed upon the bed plate. According to various embodiments, stationary and/or movable bed plates in loom system 100 may be utilized to produce net shape preforms, such as net shape carbon preforms for brakes. Loom system 100 may be advantageously utilized to form a near net shape composite structure with minimum material waste. Stationary bed plates may be smooth bed plates, such that the material to form the composite structure rotates over, and with respect to, the stationary bed plate to facilitate layering and/or needling the textile. Movable bed plates may be rotatable bed plates that comprise a surface which generates friction between the bed plate and the material and/or the transport layer such that the bed plates move and/or entrain the material to facilitate layering the material.

In various embodiments, a transport layer disposed on base layer 113 may be configured to rotate about axis of rotation 111 in direction 141. The bed plate under the transport layer may rotate with transport layer, or the bed plate may remain stationary. Such rotation may be accomplished by a turntable. The transport layer may comprise a robust, low cost substrate, such as cotton, rayon, polyester, woven carbon fabric, and/or other low cost natural and/or synthetic yarns. Cotton may be used as the transport layer because it burns cleanly and/or combusts completely during subsequent processing of the composite structure, such as densification. In various embodiments, the transport layer may be a combination of a synthetic fiber base and a carbon fiber fabric top surface. As desired, other fibers and/or combinations of various materials may be used for the fabric substrate. The transport layer may be fabricated in the shape of an annulus. The transport layer may be any desired thickness. The transport layer, in response to being secured, at least temporarily, to loom 150 and/or the bed plate may be a transport mechanism for carbon short fibers 121 which form fibrous layers 12 in composite structure 10. In response to the targeted/predetermined number of fibrous layers 12 being formed, in various embodiments, the mechanisms securing the edges of the first layer may be released and the composite structure may be easily removed manually and/or mechanically from the loom 150.

In various embodiments, loom 150 may comprise a rotating inner crown 180 and/or a rotating outer crown 185. Rotating inner crown 180 may be adjacent to and/or part of an inner diameter 152. Rotating outer crown 185 may be adjacent to and/or part of an outer diameter 154. Rotating inner crown 180 and/or rotating outer crown 185 may comprise one or more pins 182. Pins 182 may be configured to secure the transport layer to rotating inner crown 180 and/or rotating outer crown 185. However, the transport layer may be secured to rotating inner crown 180 and/or rotating outer crown 185 in any suitable manner including by bolts, clamps, adhesive, and/or the like. Additional information about the transport layer, bed plates, and/or loom 150 may be found at U.S. patent application Ser. No. 14/286,077 filed on May 23, 2014 and entitled "Systems and Methods for Transport of Fibers to/from a Circular Needle-Punching Loom", which is incorporated by reference herein in its entirety.

Base layer 113, which may be a bedplate and/or transport layer, may be configured to facilitate the forming of fibrous layers 12 by receiving carbon short fibers 121 during rotation about axis of rotation 111. Carbon short fibers 121 may be transferred onto base layer 113 from a first vibratory feed ramp 120. First vibratory feed ramp 120 may comprise an outer edge 124 corresponding to outer diameter 154 of loom 150 and/or base layer 113, and an inner edge 122 corresponding to inner diameter 152 of loom 150 and/or base layer 113. Inner edge 122 and outer edge 124 may comprise walls configured to keep carbon short fibers 121 on first vibratory feed ramp 120 as carbon short fibers 121 travel down first vibratory feed ramp 120 in direction 102. First vibratory feed ramp 120 may have a surface upon which carbon short fibers 121 may travel to base layer 113. Carbon short fibers 121 may be transferred onto first vibratory feed ramp 120 from a first loader 170. The amount and/or number of carbon short fibers 121 transferred from first loader 170 to first vibratory feed ramp 120 may be controlled by a load cell and/or a gravimetric feeder and controller.

In various embodiments, during the transfer of carbon short fibers 121 from first vibratory feed ramp 120 to base layer 113, first vibratory feed ramp 120 may vibrate, which may facilitate the movement of carbon short fibers 121 in direction 102 along first vibratory feed ramp 120, and/or facilitate the transfer of carbon short fibers 121 from first vibratory feed ramp 120 to base layer 113. The vibration of first vibratory feed ramp 120 may facilitate a uniform distribution of carbon short fibers 121 onto base layer 113 between inner diameter 152 and outer diameter 154. A vibration generator 128 may be coupled to first vibratory feed ramp 120 and/or loom 150, and may cause first vibratory feed ramp 120 to vibrate. In various embodiments, vibration generator 128 may be comprised in first vibratory feed ramp 120. Vibration generator 128 may generate vibrations at any suitable frequency and amplitude. In various embodiments, vibration generator 128 may cause first vibratory feed ramp 120 to vibrate in a direction parallel to axis of rotation 111 or in a direction perpendicular to axis of rotation 111, or in any other suitable direction.

The areal weight of each fibrous layer 12 being formed in loom 150 may be controlled by the rate of delivery of the carbon short fibers 121. The rate at which carbon short fibers 121 are delivered to base layer 113 may be controlled by first vibratory feed ramp 120, the gravimetric feeder and controller, and/or the vibration frequency and/or amplitude of vibrations generated by vibration generator 128. For example, a greater vibrational frequency and/or amplitude may increase the transfer rate of carbon short fibers 121 from first vibratory feed ramp 120 to base layer 113. Additionally, the areal weight of each fibrous layer 12 may be controlled by the rotation rate of base layer 113 about axis of rotation 111. For example, the faster the rotation rate of base layer 113, the fewer carbon short fibers 121 will be transferred from first vibratory feed ramp 120 to base layer 113 per unit time on any given portion of a fibrous layer 12 being formed in a composite structure 10.

In various embodiments, carbon short fibers 121 may comprise one or more of OPF fibers, carbonized carbon fibers, phenolic based fibers, and/or pitched based fibers such as thermoset pitch fiber. Carbon fiber strands, which may be comprised in carbon tows, may be cut to form carbon short fibers 121. In various embodiments, carbon short fibers 121 may have any suitable length. In various embodiments, carbon short fibers 121 may have a length between 0.5 inch (1.27 centimeters) and 2.0 inches (5.08 centimeters). In various embodiments, carbon short fibers 121 may have a length between 0.75 inch (1.91 centimeters) and 1.5 inches (3.81 centimeters). In various embodiments, carbon short fibers 121 may have a length greater than 2.0 inches (5.08 centimeters), or less than 0.5 inch (1.27 centimeters). Carbon short fibers 121 with the dimensions described herein may be accurately metered and distributed by the vibrations of first vibratory feed ramp 120 and vibrations generator 128 during transfer from first vibratory feed ramp 120 to base layer 113, without carbon short fibers 121 breaking or becoming tangled.

In various embodiments, loom system 100 may include a roller 160 configured to flatten and compress carbon short fibers 121 that have been transferred from first vibratory feed ramp 120 to base layer 113. Roller 160 may be any suitable shape, such as conical or cylindrical, and may rotate about roller axis 161. In various embodiments, roller 160 may remain in the same position on loom 150 and flatten and/or compress carbon short fibers 121 as base layer 113 rotates about axis of rotation 111 with respect to roller 160.

In various embodiments, base layer 113 may transport carbon short fibers 121 to a compression zone 115. Compression zone 115 of loom system 100 may comprise a compression board 116. Compression board 116 may be configured to move up and down along or parallel to axis 135 similar to compression board 16 in FIG. 1B, in a reciprocating manner. In various embodiments, compression board 116 may not comprise one or more needles 114, and therefore, compression board 116 may compress carbon short fibers 121 without creating z-fibers, as described herein. In various embodiments, compression board 116 may comprise one or more needles 114, which penetrate carbon short fibers 121 of each fibrous layer 12 in the composite structure. In response, z-fibers may be formed in each fibrous layer 12.

In various embodiments, with further reference to FIGS. 1B, 2A, and 2B, in response to being compressed by roller 160 and/or compression board 116, carbon short fibers 121 may tend to be forced toward, or squeezed out, inner diameter 152 and/or outer diameter 154. Accordingly, in various embodiments, an inner sacrificial edge 104 and/or an outer sacrificial edge 106 may be disposed for each fibrous layer 12, which may occur simultaneously with the transferring of carbon short fibers 121 from first vibratory feed ramp 120 to base layer 113. Inner sacrificial edge 104 may be disposed along inner diameter 152 and outer sacrificial edge 106 may be disposed along outer diameter 154 to prevent carbon short fibers 121, or other material, from being squeezed out inner diameter 152 and/or outer diameter 154. Inner sacrificial edge 104 and/or outer sacrificial edge 106 may be disposed as continuous strands, or as segments 107. In various embodiments, Inner sacrificial edge 104 and/or outer sacrificial edge 106 may be comprised of bands or strips of fabric, or one or more carbon tows, which may comprise carbon fiber and/or synthetic fibers.

In operation, in various embodiments, referring to FIGS. 1A, 1B, 2A, and 2B, carbon short fibers 121 may be continuously transferred from first loader 170 to first vibratory feed ramp 120, and from first vibratory feed ramp 120 to base layer. base layer 113 may be disposed at the top of loom 150 to form the first fibrous layer 12 of carbon short fibers 121. During such transfers of carbon short fibers 121, first vibratory feed ramp 120 may be vibrating because of vibration generator 128, and base layer 113 may be rotating about axis of rotation 111. Roller 160 may flatten carbon short fibers 121 as carbon short fibers reach roller 160. Compression board 116 may compress, and/or needle (in embodiments in which compression board 116 comprises needles 114), carbon short fibers 121 in response to carbon short fibers reaching compression zone 115. In response to base layer 113 making a full revolution, a full fibrous layer 12 may be formed. In various embodiments, in response to a full fibrous layer 12 being formed, the base layer 113 may recess into loom 150 along or parallel to axis 151 to allow space for a subsequent fibrous layer 12 to be formed. The process of creating fibrous layers 12 is repeated until a desired thickness and/or number of fibrous layers 12 of composite structure 10 is achieved.

Figure 2C:
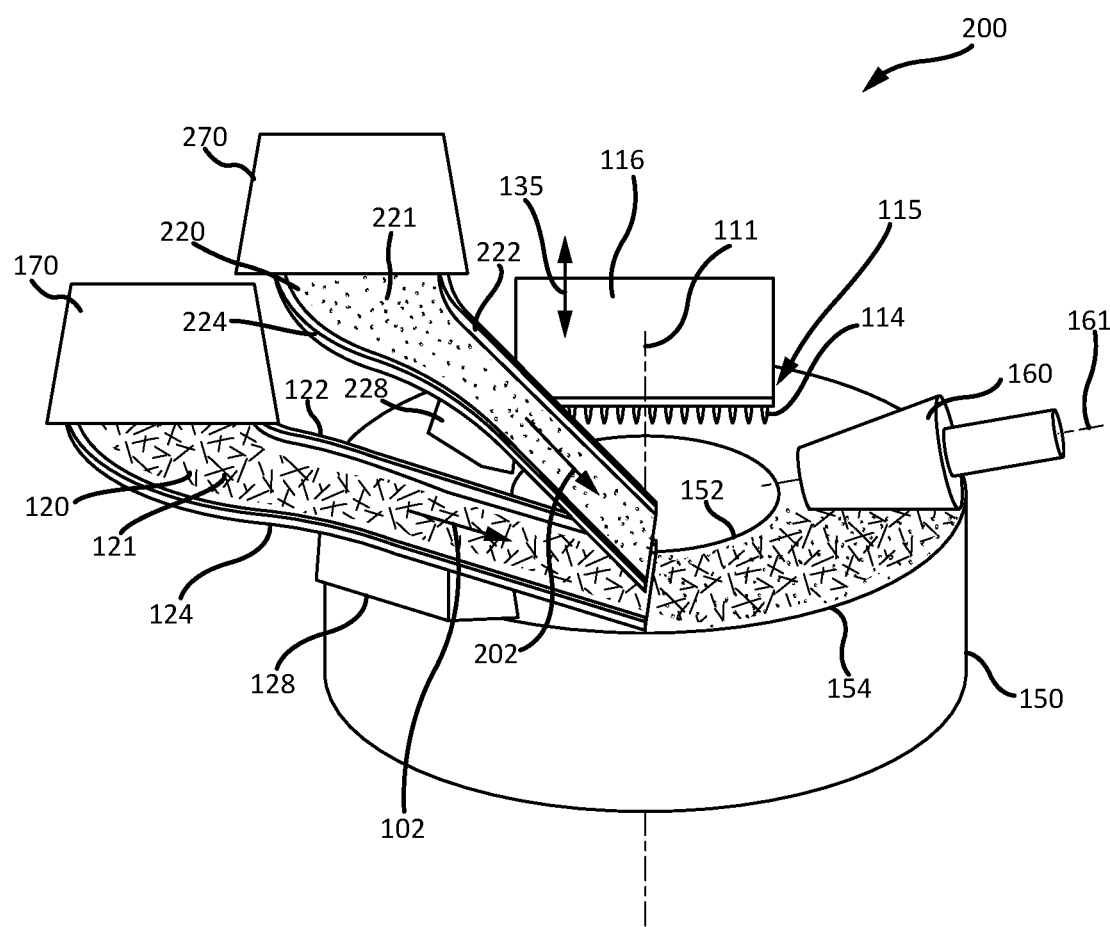
FIG. 2C illustrates a perspective view of a loom system with multiple vibratory feed ramps, in accordance with various embodiments.

In various embodiments, with reference to FIGS. 1B and 2C, a loom system 200, which is an apparatus for forming a composite structure, may comprise a second loader 270 and/or a second vibratory feed ramp 220. A second vibration generator 228 may be coupled to second vibratory feed ramp 220. In various embodiments, one vibration generator may provide vibrations to first vibratory feed ramp 120 and second vibratory feed ramp 220. Second vibratory feed ramp 220 may comprise a second inner edge 222 corresponding to inner diameter 152, and a second outer edge 224 corresponding to outer diameter 154. Second loader 270 may be configured to transfer a secondary material 221 to second vibratory feed ramp 220. Second vibratory feed ramp 220 may be configured to transfer secondary material 221 in direction 202 to base layer 113.

Second vibration generator 228 may vibrate second vibratory feed ramp 220 to facilitate the transfer of secondary material 221 from second vibratory feed ramp 220 to base layer 113, the same as or similar to the transfer of carbon short fibers 121 from first vibratory feed ramp 120 to base layer 113 as described herein. Secondary material 221 may be disposed on top of, and/or among, carbon short fibers 121 such that secondary material 221 is comprised in each fibrous layer 12 being formed. Secondary material 221 and carbon short fibers 121 may be flattened by roller 160 and compressed by compression board 116 during rotation of base layer 113. Compression board 116 may or may not comprise needles 114. In various embodiments without needles 114, carbon short fibers 121 and secondary material 221 may be compressed without being needled, such that no materials travel in the z-direction. In various embodiments, compression board 116 may compress the material (i.e., carbon short fibers 121 and/or secondary material 221) after the completion of each fibrous layer 12 (i.e., after each revolution of base layer 113), or after the completion of multiple fibrous layers 12.

Figure 3:
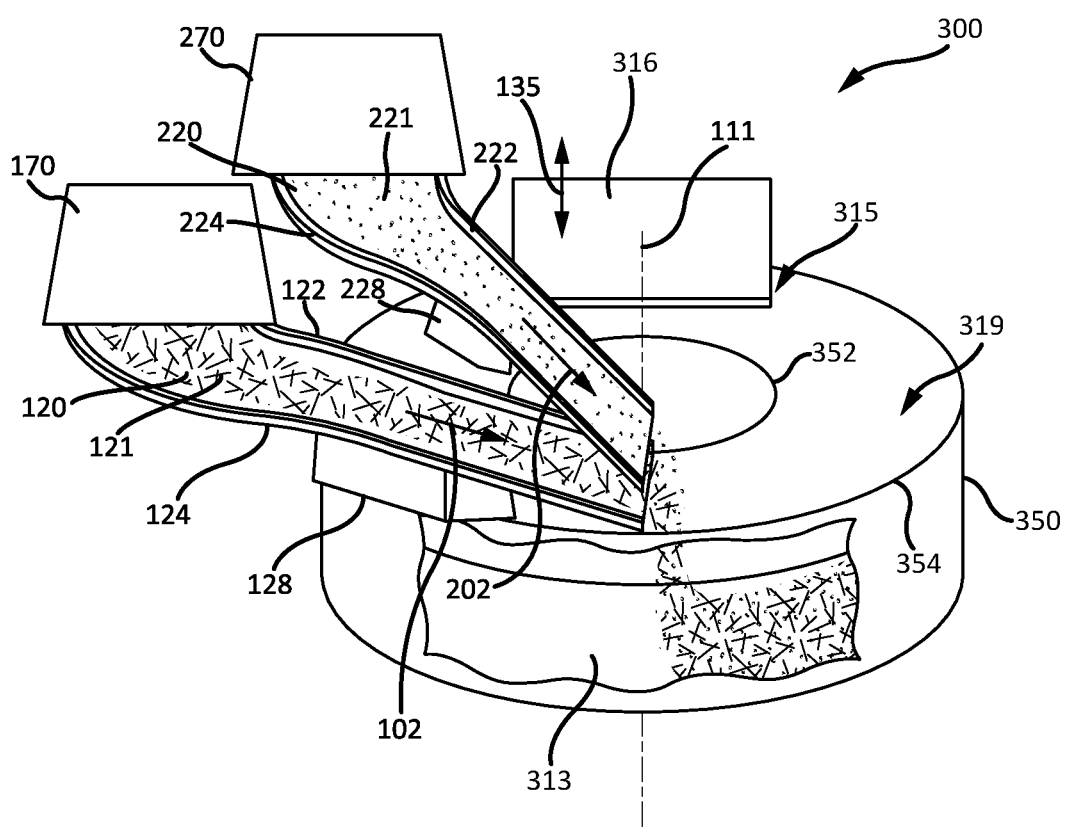
FIG. 3 illustrates a perspective view of a mold system, in accordance with various embodiments.

Referring to FIG. 3, in accordance with various embodiments, an apparatus for forming a composite structure is depicted, in accordance with various embodiments. The apparatus for forming a composite structure may be a mold system 300. Mold system 300 may comprise a first loader 170 and a first vibratory feed ramp 120 to deliver carbon short fibers 121, a second loader 270 and a second vibratory feed ramp 220 to deliver secondary material 221, a compression board 316, a first vibration generator 128, and/or a second vibration generator 228. In various embodiments, compression board 316 may or may not comprise at least one needle, such as needles 114 in FIGS. 2A and 2C. Elements with the like element numbering between figures are intended to be the same and will not be repeated for the sake of clarity. Mold system 300 may comprise a cavity 319 within a mold 350. Mold 350 and cavity 319 may have an inner diameter 352 and an outer diameter 354. Cavity 319 may comprise a floor or base layer 313 (similar to base layer 13 upon which fibrous layers 12 are formed, as depicted in FIG. 1). In various embodiments, base layer 313 may be a bedplate and/or transport layer (similar to bed plate and/or transport layer discussed in relation to in FIGS. 2A and 2B). In various embodiments, there may be no bedplate and/or transport layer, but only a floor of cavity 319 serving as base layer 313. Base layer 313 may remain fixed at the bottom of cavity 319, or fixed at any desired position along the height of mold 350, so as to create a composite structure with a desired thickness.

In operation, in various embodiments, referring to FIGS. 1A, 1B, and 3, carbon short fibers 121 may be continuously transferred from first loader 170 to first vibratory feed ramp 120, and from first vibratory feed ramp 120 to base layer 313 in cavity 319. During such transfers of carbon short fibers 121, first vibratory feed ramp 120 may be vibrating because of vibration generator 128, and base layer 313 and/or mold 350 may be rotating about axis of rotation 111. In various embodiments, the base layer 313 may be stationary in cavity 319, and mold 350 may rotate about axis of rotation 111 during the transferring of carbon short fibers 121 to first vibratory feed ramp 120. In various embodiments, secondary material 221 may be transferred from second vibratory feed ramp 220 to base layer 313 in cavity at the same time as the transferring of carbon short fibers 121 to first vibratory feed ramp 120, such that secondary material 221 is disposed on top of or within carbon short fibers 121. Secondary material 221 may be any material discussed herein.

Compression board 316 may compress, and/or needle (in embodiments in which compression board 316 comprises needles 114, depicted in FIGS. 2A and 2C) carbon short fibers 121 and/or secondary material 221 in response to carbon short fibers 121 and/or secondary material 221 reaching compression zone 315 during rotation. In response to base layer 313 and/or mold 350 making a full revolution, a full fibrous layer 12 may be formed. In various embodiments, compression zone 315 may be any area of cavity 319 within mold 350. For example, compression zone 315, in which carbon short fibers 121 and/or secondary material 221 are compressed, may be a portion of the base layer 313 in cavity 319. In various embodiments, the compression zone may be the entire area of the base layer 313 in cavity 319, in which a compression board, such as compression board 316, or a mold, such as mold 350, would position itself so as to be able to allow compression of the entire annular area of cavity 319. In various embodiments, compression of carbon short fibers 121 and/or secondary material 221 may occur only after formation of all desired fibrous layers 12. The process of creating fibrous layers 12 is repeated until a desired thickness and/or number of fibrous layers 12 of composite structure 10 is achieved.

In various embodiments, referring to FIGS. 1A-1B, 2A-2C, and 3, secondary material 221 may comprise a ceramic material such as silicon carbide, boron carbide, and/or any other suitable ceramic material. In various embodiments, secondary material 221 may comprise a powdery resin, carbon particles, and/or graphite particles. In various embodiments, secondary material 221 may comprise a combination of any of the examples of secondary material 221 listed herein. In various embodiments, secondary material 221 may comprise a different kind of carbon short fiber than the kind delivered by first vibratory feed ramp 120, such as thermoset pitch fiber. In various embodiments, ceramic particles of secondary material 221 may be less than 1 micron ($3.94 \times 10^{-5}$ inch) in size. In various embodiments, particles of secondary material 221 may be between 1 micron ($3.94 \times 10^{-5}$ inch) and 25 microns ($9.84 \times 10^{-4}$ inch) in size. In various embodiments, particles of secondary material 221 may be between 1 micron ($3.94 \times 10^{-5}$ inch) and 5 microns ($1.97 \times 10^{-4}$ inch) in size. In various embodiments, particles of secondary material 221 may be between 1 micron ($3.94 \times 10^{-5}$ inch) and 2 microns ($7.87 \times 10^{-5}$ inch) in size. In various embodiments, particles of secondary material 221 may be between 1.2 micron ($4.72 \times 10^{-5}$ inch) and 1.8 microns ($7.09 \times 10^{-5}$ inch) in size. In various embodiments involving compression of carbon short fibers 121 and/or secondary material 221 by compression board 116 without needles 114, particles of secondary material 221 may be greater than 2 microns ($7.87 \times 10^{-5}$ inch) in size. In various embodiments, particles of secondary material 221 may be different sizes between 1 micron ($3.94 \times 10^{-5}$ inch) and 25 microns ($9.84 \times 10^{-4}$ inch), and/or carbon short fibers 121 may be different lengths from 0.5 inch (1.27 centimeters) and 2.0 inches (5.08 centimeters). Such varying lengths of carbon short fibers 121 and/or particles of secondary material 221 may allow optimum packing of carbon short fibers 121 and/or secondary material 221 in each fibrous layer 12.

In various embodiments, the target fiber volume in a composite structure formed in embodiments in which compression board 116, 316 comprises at least one needle 114 may be between 10% by volume and 30% by volume, between 15% by volume and 25% by volume, or between 18% by volume and 25% by volume. In various embodiments involving compression of carbon short fibers 121 and/or secondary material 221 by compression board 116, 316 without needles 114, the target fiber volume in a composite structure may be between 40% and 50% by volume, or less. In various embodiments, the target volume of secondary material 221 in a composite structure may be between 10% by volume and 30% by volume, between 15% by volume and 25% by volume, or between 20% by volume and 25% by volume.

In various embodiments, there may be any number of additional loaders and/or vibratory feed ramps in a loom system, such as loom system 100, or a mold system, such as mold system 300, to add various materials to the fibrous layers 12 of a composite structure. Additionally, carbon short fibers 121, secondary material 221, and/or any other material to be comprised in a composite structure may be transferred to the base layer 113, 313 by only first loader 170 and first vibratory feed ramp 120, or any number of loaders and vibratory feed ramps.

In various embodiments, carbon short fibers 121 and/or secondary material 221 are disposed onto base layer 113, 313, which may be a bed plate and or a transport layer, as described herein. Therefore, any description involving base layer 113, 313 herein may be applied to various embodiments in which the apparatus for forming a composite structure, for example a loom system, such as loom system 100, or mold system, such as mold system 300, comprises a bed plate and/or transport layer as base layer 113, 313. Also, compression zone 115, 315 may be any area of loom 150 or mold 350, respectively. For example, compression zone 115, 315, in which carbon short fibers 121 and/or secondary material 221 are compressed, may be a portion of base layer 113, 313. In various embodiments, the compression area may be the entire area of base layer 113, 313, in which a compression board, such as compression board 116, 316, would position itself so as to be able to compress the entire annular area of base layer 113, 313.

Figure 4A:
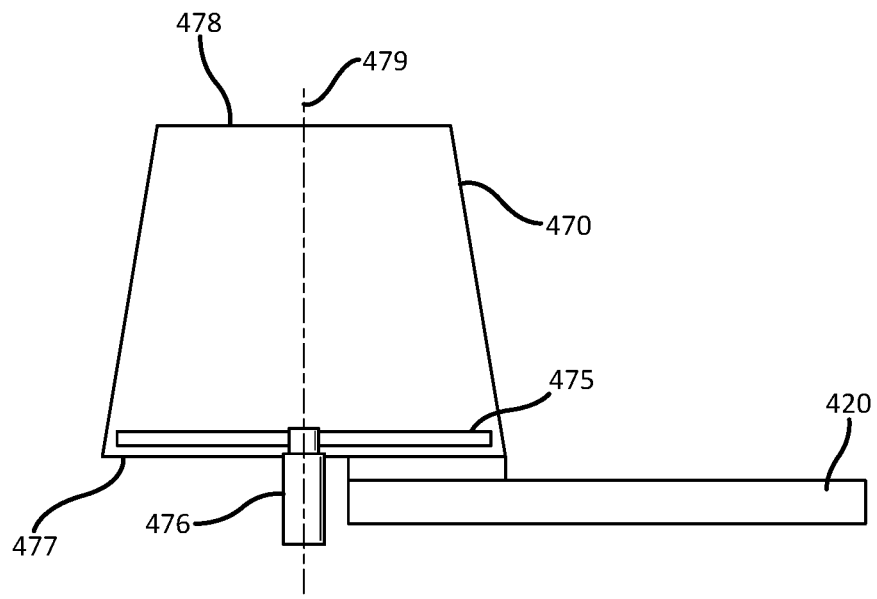
FIGS. 4A and 4B illustrate perspective views of a loader and a vibratory feed ramp, in accordance with various embodiments.
Figure 4B:
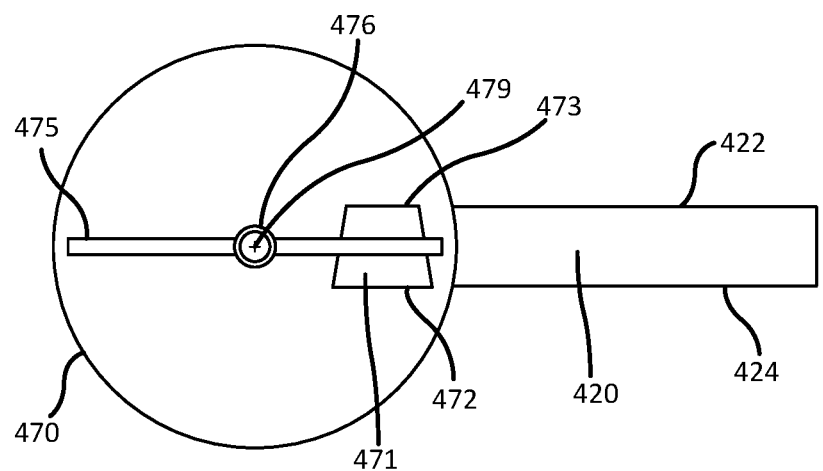
Figure 4C:
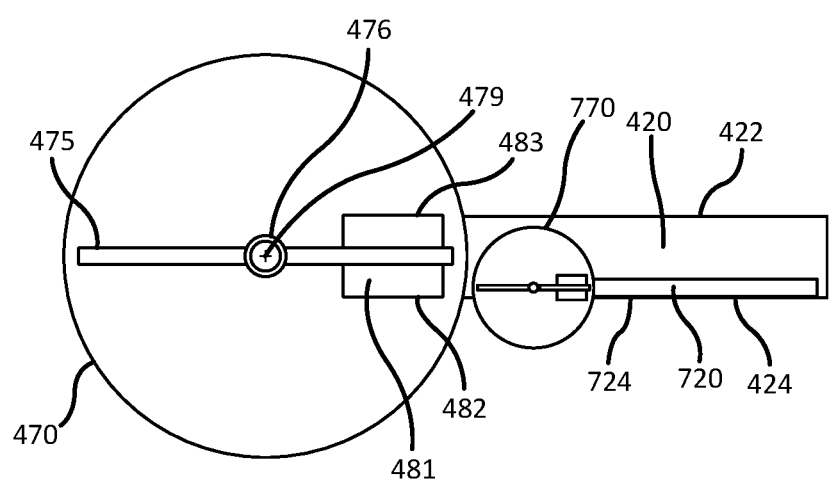
FIG. 4C illustrates a perspective view of multiple loaders and multiple vibratory feed ramps, in accordance with various embodiments.

Referring to FIGS. 4A and 4B, a loader 470 and a vibratory feed ramp 420 are depicted, in accordance with various embodiments. Loader 470 and vibratory feed ramp 420 may be comprised in an apparatus for forming a composite structure, for example, a loom assembly, such as loom system 100 in FIGS. 2A and 2B, and/or in a mold assembly, such as mold system 300 in FIG. 3, and may correspond to first loader 170 and first vibratory feed ramp 120, or second loader 270 and second vibratory feed ramp 220, respectively. Loader 470 may comprise any suitable shape. In various embodiments, loader 470 may comprise an output end 477 that is larger than an input end 478. Such a configuration prevents the material to be delivered from experiencing as much pressure from material above as the pressure that would be experienced with a loader comprising an output end 477 that is the same or smaller than input end 478. However, loader 470 may comprise such configurations. Loader 470 may comprise a rotating blade 475, which may rotate via a rotator 476 about an axis of rotation 479. Rotating blade 475 may facilitate the transfer of material (i.e., carbon short fibers and/or secondary material) to vibratory feed ramp 420.

In various embodiments, loader 470 may comprise a loader hole 471 through which material may be transferred to vibratory feed ramp 420. With combined reference to FIGS. 2A, 2C, 3, 4A, and 4B, vibratory feed ramp 420 may comprise an inner edge 422 and an outer edge 424. Inner edge 422 may correspond to inner diameter 152, 352. Outer edge 424 may correspond to outer diameter 154, 354. In operation, the base layer 113, 313 may be rotating about axis of rotation 111. Therefore, the angular velocity of outer diameter 154, 354 may be greater than the angular velocity of inner diameter 152, 352. This may cause an uneven amount of material to be transferred from vibratory feed ramp 420 to base layer 113, 313, in that the area of base layer 113, 313 proximate to outer diameter 154, 354 may receive less material (such as carbon short fibers 121 and/or secondary material 221) from vibratory feed ramp 420 than the area of base layer 113, 313 proximate to inner diameter 152, 352.

In light of this possibly uneven distribution of material, in various embodiments, loader hole 471 may comprise a first dimension 472 corresponding to outer edge 424 of vibratory feed ramp 420 and outer diameter 154, 354 that is larger than a second dimension 473 of loader hole 471, which corresponds to inner edge 422 of vibratory feed ramp 420 and inner diameter 152, 352. Therefore, more material (i.e., carbon short fibers 121 and/or secondary material 221) may be transferred from loader 470 to vibratory feed ramp 420 proximate to outer edge 424 and outer diameter 154, 354 to compensate for the greater angular velocity of outer diameter 154, 354.

In various embodiments, referring to FIGS. 2A-2C, 3, and 4C, the loader hole may be any suitable shape with any suitable dimensions, including symmetrical shapes, such as loader hole 481. With loader hole 481 having a first dimension 482 that is the same as a second dimension 483, in various embodiments, loom system 100 and/or mold system 300 may comprise at least one a supplemental loader 770 and at least one supplemental vibratory feed ramp 720 to compensate for a possibly uneven distribution of material between inner diameter 152, 352 and outer diameter 154, 354. Supplemental loader 770 and/or supplemental vibratory feed ramp 720 may be any suitable size relative to loader 470 and/or vibratory feed ramp 420. Supplemental vibratory feed ramp 720 may comprise an outer edge 724 that corresponds with outer edge 424 of vibratory feed ramp 420 and outer diameter 154, 354. Therefore, vibratory feed ramp 420 may deliver a uniform amount of material to loom 150 or mold 350 between inner diameter 152, 352 and outer diameter 154, 354, while supplemental loader 770 and supplemental vibratory feed ramp 720 may provide additional material to an area proximate to outer diameter 154, 354 to compensate for the greater angular velocity of outer diameter 154, 354. Supplemental vibratory feed ramp 720 may transfer the additional material to outer edge 424 of vibratory feed ramp 420 and/or directly to base layer 113, 313. In various embodiments, supplemental vibratory feed ramp 720 may comprise a supplemental vibration generator, similar to vibration generator 128, which causes supplemental vibratory feed ramp 720 to vibrate. In various embodiments, loom system 100 and/or mold system 300 may comprise any suitable number of supplement loaders and/or supplemental vibratory feed ramps to compensate for the greater angular velocity of outer diameter 154, 354.

Figure 5:
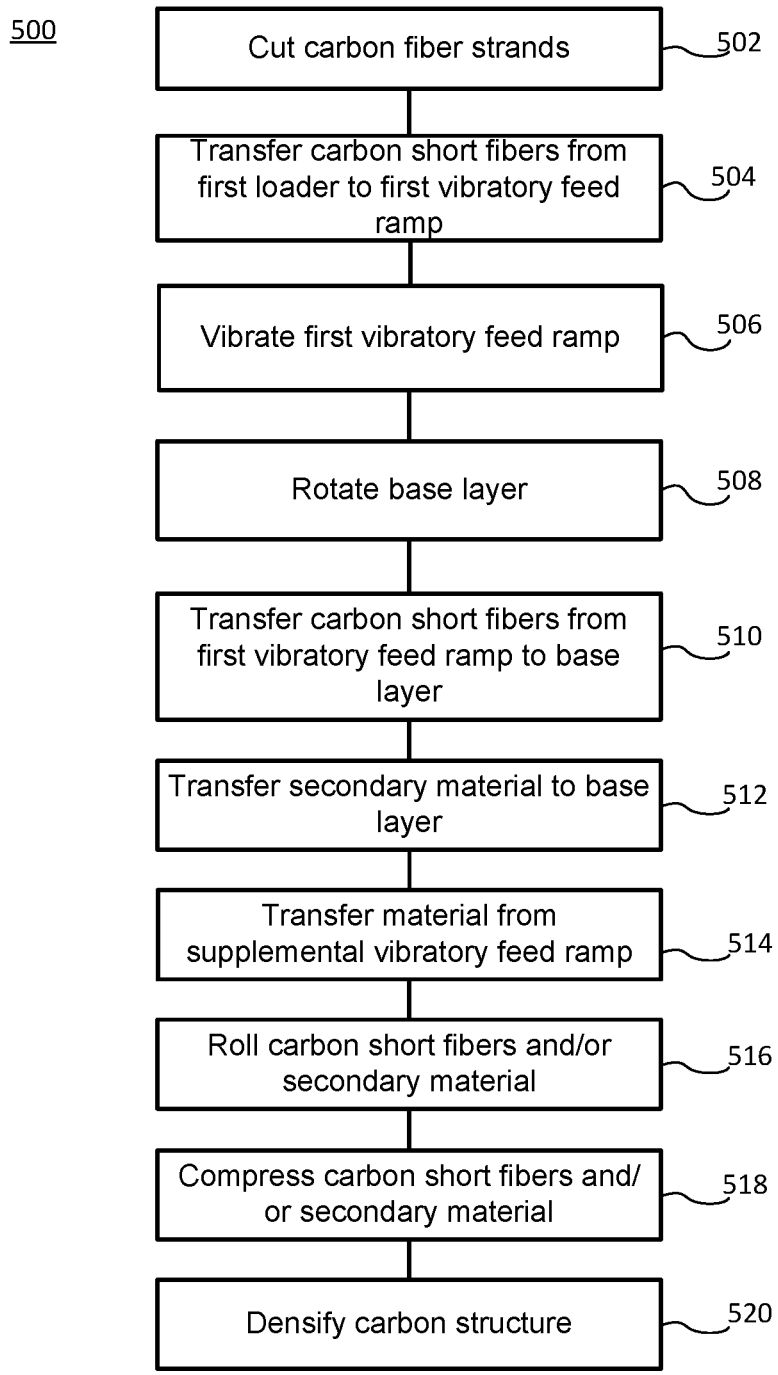
FIG. 5 illustrates a method of forming a composite structure, in accordance with various embodiments.

FIG. 5 depicts a method 500 for forming a composite structure, in accordance with various embodiments. With combined reference to FIGS. 5 and 2A-2C, carbon fiber strands may be cut (step 502) to lengths discussed herein to form carbon short fibers 121. Carbon short fibers 121 may be disposed in first loader 170, which may be in fluid communication with a first vibratory feed ramp 120. Carbon short fibers 121 may be transferred from first loader 170 to first vibratory feed ramp 120 (step 504), for example, through loader hole 471 or 481 depicted and discussed in conjunction with FIGS. 4A-4C. During, or as part of, step 504, an inner sacrificial edge 104 and/or an outer sacrificial edge 106 may be disposed on base layer 113. As discussed herein, the base layer may be a bed plate and/or transport layer. Inner sacrificial edge 104 may be disposed along inner diameter 152 and outer sacrificial edge 106 may be disposed along outer diameter 154 in order to prevent carbon short fibers 121, or other material, from being squeezed out inner diameter 152 and/or outer diameter 154. First vibratory feed ramp 120 may be vibrated (step 506) by vibration generator 128 to facilitate the transfer of carbon short fibers 121 from first vibratory feed ramp 120 to base layer 113 in loom 150. Base layer 113 may be rotated (step 508) about axis of rotation 111. Carbon short fibers 121 may be transferred from first vibratory feed ramp 120 to base layer 113 (step 510) to form fibrous layers 12 (depicted in FIGS. 1A and 1B). Step 510 may occur while first vibratory feed ramp 120 is vibrating (step 506) and/or while base layer is rotating (step 508).

In various embodiments, a secondary material 221 may be transferred to base layer 113 (step 512) via second loader 270 and second vibratory feed ramp 220. Second vibratory feed ramp 220 may be vibrated by second vibration generator 228 during the transfer of secondary material 221 from second vibratory feed ramp 220 to base layer 113. Secondary material 221 may be a ceramic material, a carbon filler material, and/or any other suitable material, such as those described herein. Step 510 and step 512 may occur simultaneously so carbon short fibers 121 are intermixed with secondary material 221. In various embodiments, material, such as carbon short fibers 121 and/or secondary material 221, may be transferred from a supplementary vibratory feed ramp 720 (step 514) onto base layer 113 as described in connection with FIG. 4C herein. Carbon short fibers 121 and/or secondary material 221 may be rolled (step 516) by roller 160 so as to flatten carbon short fibers 121 and/or secondary material 221.

In various embodiments, carbon short fibers 121 and/or secondary material 221 may be compressed (step 518) in compression zone 115 by compression board 116. Compression board 116 may or may not comprise one or more needles 114 to needle the material and create z-fibers. Embodiments including ceramic materials as secondary material 221 may be compressed by compression board 116 without needles 114, thus carbon short fibers would only be in the x and y-directions, with no z-fibers, as depicted in FIG. 1B, which may be called a "2D" or "two-dimensional" composite structure. Embodiments without ceramic materials as secondary material 221 may be compressed by compression board 116 with needles 114, thus forming z-fibers.

As described herein, with combined reference to FIGS. 1A, 1B, 2A-2C, and 5 a fibrous layer 12 is formed with each revolution of base layer 113 about axis of rotation 111 to form composite structure 10. Forming each fibrous layer 12 may comprise any order or combination of steps 502 through 518. After each revolution, base layer 113 may recess to make room for the next fibrous layer 12. In response to composite structure 10 being formed by method 500 achieving a desired number of fibrous layers 12 and/or a desired thickness, the composite structure 10 may be removed from loom 150 comprising an annular net shape. A net shape composite structure 10, a preform in this case, indicates that the initial production of the item is very close to the final (net) shape.

In various embodiments, composite structure 10 may then be densified (step 520) using any suitable densification method, such as at least one of chemical vapor infiltration (CVI) (which may include pyrolytic carbon and/or silicon carbide), silicon melt infiltration, and/or pre-ceramic polymer infiltration. Composite structure 10 may be removed from loom 150 in order to be densified. In various embodiments employing CVI to densify composite structure 10, one or multiple CVI cycles may be employed during densification. Each CVI cycle may be followed by a heat treatment. Heat treatment(s) following CVI cycles may be subjected at a temperature between 1600° C. (2912° F.) and 2400° C. (4352° F.). Silicon melt may comprise composite structure 10 comprising a carbon/graphite material, silicon carbide fibers and/or particles, and/or boron carbide particles, being heated while in contact with a source of silicon. Molten silicon infiltrates the porosity of composite structure 10 to densify composite structure 10. Pre-ceramic polymer infiltration may comprise a pre-ceramic polymer being applied to composite structure 10. A pre-ceramic polymer may be polymer that can be pyrolyzed to form a ceramic material, for example, a polycarbosilane resin, such as that provided by Starfire® Systems SMP-10. Composite structure 10 may be subjected to one or more polymer infiltration and pyrolysis (PIP) cycles, which may comprise being infiltrated by the pre-ceramic polymer and then pyrolyzed at temperatures ranging from 800° C. (1472° F.) to 1800° C. (3272° C.) to form a ceramic material, such as silicon carbide from a pre-ceramic polymer of polycarbosilane resin.

In various embodiments, the system and methods described herein may be used to form composite structures comprising resin matrices, such as phenolic, epoxy, and/or polyester resins, and/or various other high-temperature resins. In various embodiments, before or after densification of composite structure 10, composite structure 10 may be machined or otherwise formed into a desired geometry.

Figure 6:
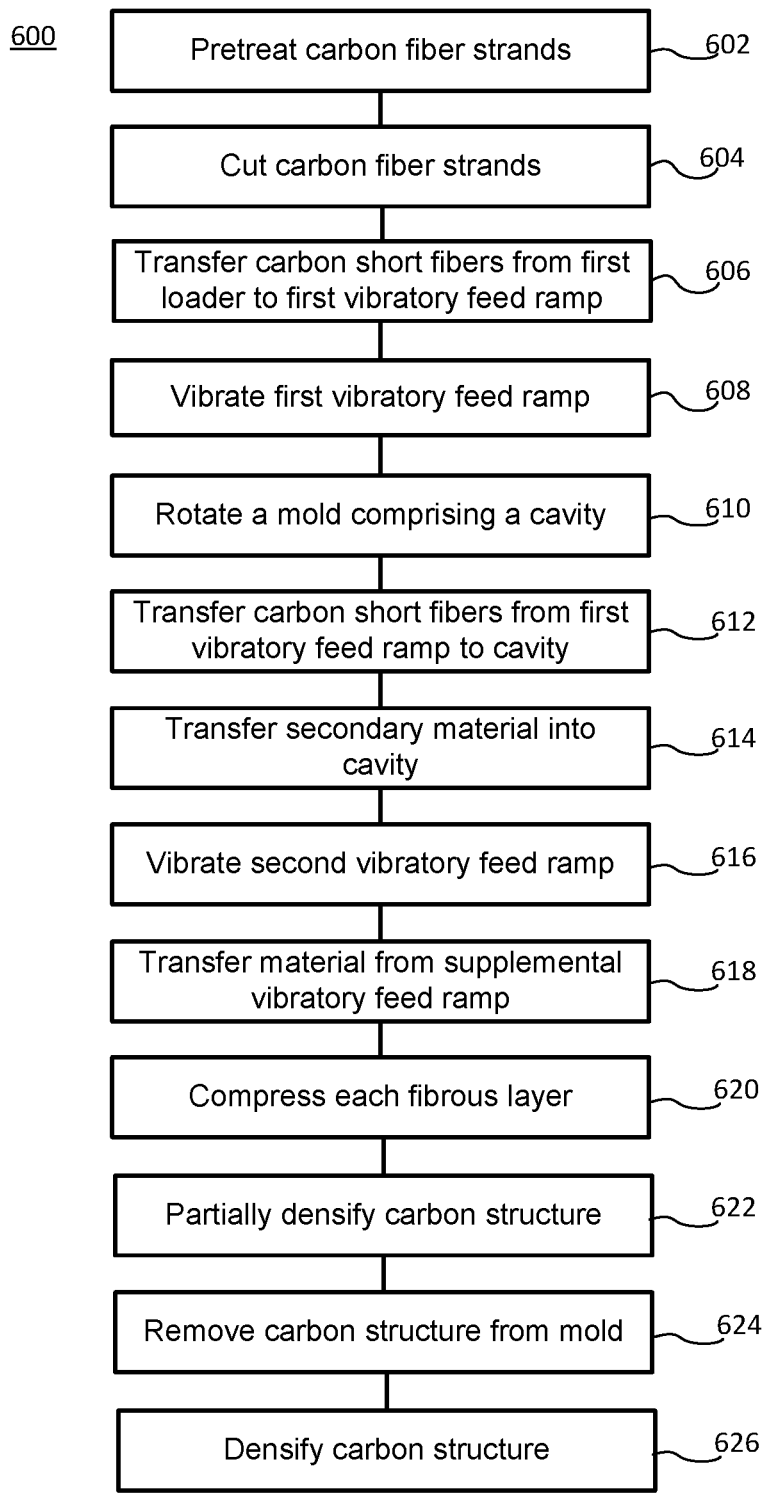
FIG. 6 illustrates an additional method of forming a composite structure, in accordance with various embodiments.

FIG. 6 depicts a method 600 for forming a composite structure, in accordance with various embodiments. With combined reference to FIGS. 1A, 1B, 3, and 6, carbon strands may be pretreated (step 602). In order to achieve desired friction and/or wear properties of a composite structure 10, a carbon fiber tow may be heat treated to a temperature between 1500° C. (2732° F.) and 2400° C. (4352° F.). Following heat treatment, an interface coating may be applied to each carbon fiber strand within the carbon fiber tow. The interface coating may comprise pyrolytic carbon, boron nitride, and/or silicon carbide along each carbon fiber strand which is applied by chemical vapor disposition (CVD). The interface coating may have a thickness of between 0.2 micron ($7.87 \times 10^{-6}$ inch) and 0.5 micron ($1.97 \times 10^{-5}$ inch). In various embodiments, the interface coating may have a thickness of between 0.3 micron ($1.18 \times 10^{-5}$ inch) and 0.4 micron ($1.57 \times 10^{-5}$ inch). In various embodiments, there may be multiple interface coatings on each carbon fiber strand comprising pyrolytic carbon, boron nitride, and/or silicon carbide, each having a thickness of between 0.2 micron ($7.87 \times 10^{-6}$ inch) and 0.5 micron ($1.97 \times 10^{-5}$ inch), or between 0.3 micron ($1.18 \times 10^{-5}$ inch) and 0.4 micron ($1.57 \times 10^{-5}$ inch). The interface coating may protect the carbon fiber in the carbon fiber strands from reacting with a ceramic matrix that may be present in composite structure 10.

In various embodiments, the carbon fiber strands may be cut (step 604) to lengths discussed herein to form carbon short fibers 121. Carbon short fibers 121 may be disposed in first loader 170, which may be in fluid communication with a first vibratory feed ramp 120. Carbon short fibers 121 may be transferred from first loader 170 to first vibratory feed ramp 120 (step 606), for example, through loader hole 471 or 481 depicted and discussed in conjunction with FIGS. 4A-4C. First vibratory feed ramp 120 may be vibrated (step 608) by vibration generator 128 to facilitate the transfer of carbon short fibers from first vibratory feed ramp 120 to cavity 319 of mold 350. Mold 350, and cavity 319 comprised in mold 350, may be rotated (step 610). Cavity 319 may comprise a floor or base layer 313, which may be a bed plate and/or transport layer, such as the transport layer discussed in relation to FIGS. 2A and 2B. Base layer 313 in cavity 319 may rotate with mold 350. Carbon short fibers 121 may be transferred from first vibratory feed ramp 120 to cavity 319 (step 612) to form fibrous layers 12 (depicted in FIGS. 1A and 1B). Step 612 may occur while first vibratory feed ramp 120 is vibrating (step 608) and while base layer 313 is rotating (step 610).

In various embodiments, a secondary material 221 may be transferred to into cavity 319 (step 614) via second loader 270 and second vibratory feed ramp 220. Second vibratory feed ramp 220 may be vibrated (step 616) by second vibration generator 228 during the transfer of secondary material 221 from second vibratory feed ramp 220 to cavity 319. Secondary material 221 may be any suitable material, such as those discussed herein. Step 612 and step 614 may occur simultaneously so carbon short fibers 121 are intermixed with secondary material 221. In various embodiments, additional material, such as carbon short fibers 121 and/or secondary material 221, may be transferred from a supplementary vibratory feed ramp 720 (step 618) into cavity 319 as described in connection with FIG. 4C herein.

In various embodiments, carbon short fibers 121 and/or secondary material 221 in each fibrous layer 12 may be compressed (step 620) in compression zone 315 by compression board 316. In various embodiments, compression board 316 may not comprise one or more needles, and therefore carbon short fibers 121 and/or secondary material 221 may be compressed by compression board 316 in the x and y-directions, as depicted in FIG. 1B, forming a 2D composite structure. In various embodiments, compression board 316 may comprise one or more needles, such as needles 114 depicted in FIGS. 2A-2C, forming z-fibers during compression by compression board 316.

As described herein, with combined reference to FIGS. 1A, 1B, 3, and 6 a fibrous layer 12 is formed with each revolution of the base layer 313 about axis of rotation 111 to form composite structure 10. Forming each fibrous layer 12 may comprise any order or combination of steps 602-620. After each revolution, a new fibrous layer 12 may be formed. In response to composite structure 10 being formed by method 600 achieving a desired number of fibrous layers 12 and/or a desired thickness, in various embodiments, mold 350 may be closed with composite structure 10 remaining in cavity 319 of mold 350, and composite structure 10 may be partially densified (step 622) by any of the densification methods discussed herein. During partial densification of composite structure 10 during step 622, resin that infiltrated composite structure 10 may be cured and/or pyrolyzed. In various embodiments, composite structure 10 may be removed from mold 350 (step 624) and densified (Step 626) using any of the densification methods discussed herein. In various embodiments, composite structure 10 may be fully densified within mold 350.

In various embodiments, the mold 350 and/or loom 150 may be comprised of graphite, aluminum, plastic, and/or any other suitable material. Mold 350 may comprise perforated walls and a lid to close the mold in order to allow densification of composite structure 10 within mold 350. In various embodiments, before or after densification of composite structure 10, composite structure 10 may be machined or otherwise formed into a desired geometry.

Implementing the various steps, techniques, combinations, compounds, etc. discussed herein, below are various examples of methods of forming composite structures.

Example 1: Forming Carbon Composite with Carbonized Carbon Fiber

A smooth bed plate annular loom equipped with a vibratory feed ramp and a vibrations generator, and a transport layer made of a combined cotton/woven carbon fabric, is used to prepare an annular composite structure, a brake preform in this case. Carbon fiber strands are cut into carbon short fibers with a length of about 0.75 inch (1.91 cm), wherein "about" as used in this context only means plus or minus 0.25 inch (0.64 cm). The transferring speed of carbon short fibers to the transport layer, and bed plate rotating speed are adjusted to form fibrous layers of 550 grams per square meter to 650 grams per square meter of carbon short fiber. Thirty fibrous layers are created. The fibrous layers are compressed and needled by a compression board comprising a plurality of needles with a reciprocation rate of about 928 RPM, wherein "about" as used in this context only means plus or minus 50 RPM. Bed plate and/or transport layer may rotate at a speed of about 5.3 turns/minute, wherein "about" as used in this context only means plus or minus 1 turn/minute. The oscillation rate and rotation speed are used to optimize composite structure fabrication time corresponding to a carbon short fiber feeding speed from the vibratory feed ramp to the bed plate and/or transport layer of about 0.5 kg (1.1 lbs.) per minute wherein "about" as used in this context only means plus or minus 0.25 kg (0.55 lb.).

The composite structure is subsequently subjected to a heat treatment at temperatures between 1600° C. (2912° F.) and 2400° C. (4352° F.) and densified using CVI pyrolytic carbon.

Example 2: Forming Carbon Composite with Carbonized Carbon Fiber and Thermoset Pitch Fiber Similar equipment is used as Example 1 herein to prepare a carbon structure comprising carbon short fibers. The carbon composite will also comprise thermoset pitch fibers to raise the thermal conductivity of the composite structure. The carbon short fibers are transferred onto bed plate and/or transport layer using a first loader and a first vibratory feed ramp which is vibrated by a first vibration generator. The thermoset pitch fiber is transferred onto bed plate and/or transport layer on top of the carbon short fibers using a second loader and second vibratory feed ramp which is vibrated by a second vibration generator. The feed ratio of carbon short fiber to thermoset pitch fiber may be 75 percent by volume to 25 percent by volume, respectively. In various embodiments, the feed ratio of carbon short fiber to thermoset pitch fiber may be 85 percent by volume to 15 percent by volume, respectively.

The composite structure is subsequently subjected to a heat treatment at temperatures between 1600° C. (2912° F.) and 2400° C. (4352° F.) and densified using CVI silicon carbide.

Example 3: Forming a 2D Composite Structure

A perforated graphite mold set on a turntable for rotation is used in conjunction with a vibratory feed ramp vibrated by a vibration generator to transfer carbon short fibers from the vibratory feed ramp to the mold in a controlled fashion. The carbon short fibers may be about 1 inch (2.54 centimeters) in length and the mold may be annular, wherein "about" as used in this context only means plus or minus 0.25 inch (0.64 cm) Each fibrous layer formed may have an areal weight of about 800 grams per square meter, wherein "about" as used in this context only means plus or minus 100 grams per square meter. The composite structure is formed with 22 fibrous layers. The upper part of the graphite mold is closed to ensure about a 25% fiber volume in the composite structure, wherein "about" as used in this context only means plus or minus 5% fiber volume. The composite structure is heat treated to temperature between 1600° C. (2912° F.) and 2400° C. (4352° F.), and densified using CVI pyrolytic carbon and machined to desired part geometry.

Example 4: Forming a 2D Composite Structure Using Pre-Ceramic Polymer Infiltration A 50K carbonized carbon fiber tow is heat treated to about 2000° C. (3632° F.) (wherein "about" in this context only means plus or minus 500° C. (900° F.)) and coated with a thin interface coating of pyrolytic carbon of about 0.3 micron prior to cutting the tow into the carbon short fibers, wherein "about" as used in this context only means plus or minus 0.2 micron ($7.87 \times 10^{-6}$ inch). A perforated aluminum mold rotating on a turntable is used in conjunction with a first vibratory feed ramp which is vibrated by a first vibration generator to transfer carbon short fibers in a controlled fashion from the vibratory feed ramp to the mold. The carbon short fibers may be about 0.75 inch long (1.91 cm) carbonized carbon fibers, wherein "about" as used in this context only means plus or minus 0.25 inch (0.64 cm). A second vibratory feed ramp, which is vibrated by a second vibration generator, may transfer silicon carbide powder to the annular cavity of the mold. The targeted fiber volume following compression of the fibrous layers by a compression board molding is about 30% fiber volume, wherein "about" as used in this context only means plus or minus 10% fiber volume. Transferring of the carbon short fibers and of the silicon carbide powder to the mold is coordinated to achieve about 30% by volume carbon fiber and about 20% by volume silicon carbide powder, wherein "about" as used in this context only means plus or minus 10% by volume. Fibrous layers of about 150 grams per square meter of carbon fiber and about 176 grams per square meter of silicon carbide powder are formed in the cavity of the mold, wherein "about" as used in this context only means plus or minus 20 grams per square meter. The closed perforated mold is first vacuum infiltrated with a polycarbosilane resin such as that sold under the mark Starfire® Systems SMP-10 pre-ceramic polymer and subsequently compression molded at about 300° C. (572° F.) to cure the polycarbosilane resin, wherein "about" as used in this context only means plus or minus 50° C. (90° F.). The partially densified 2D composite structure is subsequently pyrolyzed to about 1800° C. (3272° F.) (wherein "about" as used in this context only means plus or minus 500° C. (900° F.)) and subjected to multiples PIP cycles until final porosity of the composite structure is between 10% and 15% by volume.

Example 5: Forming a 2D Composite Structure Using Pre-Ceramic Polymer Infiltration and CVI Silicon Carbide A 24K carbonized carbon fiber tow is heat treated to about 2300° C. (4172° F.) (wherein "about" in this context only means plus or minus 500° C. (900° F.)) and coated with a thin layer of pyrolytic carbon of about 0.3 micron prior to cutting the carbon fiber tow into carbon short fibers, wherein "about" as used in this context only means plus or minus 0.2 micron ($7.87 \times 10^{-6}$ inch). A perforated aluminum mold set on a turntable is used in conjunction with a first vibratory feed ramp which is vibrated by a first vibration generator to transfer carbon short fibers in a controlled fashion from the vibratory feed ramp to the mold. The carbon short fibers may be 1 inch long (2.54 cm) carbonized carbon fibers, wherein "about" as used in this context only means plus or minus 0.25 inch (0.64 cm). A second vibratory feed ramp, which is vibrated by a second vibration generator, may transfer silicon carbide powder to the annular cavity of the mold. The targeted fiber volume following compression of the fibrous layers by a compression board molding is about 21% fiber volume, wherein "about" as used in this context only means plus or minus 10% fiber volume. Transferring of the carbon short fibers and of the silicon carbide powder to the mold is coordinated to achieve about 21% by volume carbon fiber and about 10% by volume silicon carbide powder, wherein "about" as used in this context only means plus or minus 5% by volume. Fibrous layers of about 150 grams per square meter of carbon fiber and 126 grams per square meter of silicon carbide powder are formed in the cavity of the mold, wherein "about" as used in this context only means plus or minus 20 grams per square meter. The closed perforated mold is first vacuum infiltrated with Starfire® Systems SMP-10 pre-ceramic polymer (polycarbosilane resin) and subsequently compression molded at about 300° C. (572° F.) to cure the resin, wherein "about" as used in this context only means plus or minus 50° C. (90° F.). The partially densified 2D composite structure is subsequently pyrolyzed to about 1800° C. (3272° F.) in an inert atmosphere (i.e., under nitrogen or argon gas), wherein "about" as used in this context only means plus or minus 500° C. (900° F.). The partially densified 2D composite structure is subsequently densified using CVI silicon carbide until final porosity of the composite structure is between 10% and 15% by volume.

Example 6: Forming a 2D Composite Structure Using Silicon Melt Infiltration

A 50K carbonized carbon fiber tow is heat treated to about 2400° C. (4352° F.) (wherein "about" in this context only means plus or minus 500° C. (900° F.)) and coated with a dual thin interface coating of about 0.3 micron pyrolytic carbon and about 0.3 micron silicon carbide (which was applied by chemical vapor disposition) prior to cutting the tow into the carbon short fibers, wherein "about" as used in this context only means plus or minus 0.2 micron ($7.87 \times 10^{-6}$ inch). A perforated aluminum mold rotating on a turntable is used in conjunction with a first vibratory feed ramp which is vibrated by a first vibration generator to transfer carbon short fibers in a controlled fashion from the vibratory feed ramp to cavity of the mold. The carbon short fibers may be about 0.75 inch long (1.91 cm) carbonized carbon fibers, wherein "about" as used in this context only means plus or minus 0.25 inch (0.64 cm). A second vibratory feed ramp, which is vibrated by a second vibration generator, may transfer boron carbide powder to the annular cavity of the mold. The targeted fiber volume following compression of the fibrous layers by a compression board molding is about 25% fiber volume, wherein "about" as used in this context only means plus or minus 5% fiber volume. Transferring of the carbon short fibers and of the boron carbide powder to the mold is coordinated to achieve about 25% by volume carbon fiber and about 10% by volume boron carbide powder, wherein "about" as used in this context only means plus or minus 5% by volume. Fibrous layers of about 150 grams per square meter of carbon fiber and about 83 grams per square meter of boron carbide powder are formed in the cavity of the mold, wherein "about" as used in this context only means plus or minus 20 grams per square meter. The closed perforated mold is first vacuum infiltrated with a phenolic resin and subsequently compression molded to cure the resin. The carbon composite is carbonized at about 1000° C. (1832° F.) in an inert atmosphere (i.e., under nitrogen or argon gas), wherein "about" as used in this context only means plus or minus 500° C. (900° F.). Subsequently, the composite structure is subjected to silicon melt in which a mixture of silicon, phenolic resin, and carbon black is applied to the composite structure comprising boron carbide and melted to about 1450° C. (2642° F.), wherein "about" as used in this context only means plus or minus 500° C. (900° F.).

Example 7: Forming a 2D Composite Structure Using Silicon Melt Infiltration

A 24K carbonized carbon fiber tow is heat treated to about 2300° C. (4172° F.) (wherein "about" in this context only means plus or minus 500° C. (900° F.)) and coated with a dual thin interface coating of about 0.3 micron pyrolytic carbon and about 0.3 micron silicon carbide (which was applied by chemical vapor disposition) prior to cutting the tow into the carbon short fibers, wherein "about" as used in this context only means plus or minus 0.2 micron ($7.87 \times 10^{-6}$ inch). A perforated aluminum mold rotating on a turntable is used in conjunction with a first vibratory feed ramp which is vibrated by a first vibration generator to transfer carbon short fibers in a controlled fashion from the vibratory feed ramp to cavity of the mold. The carbon short fibers may be about 0.75 inch long (1.91 cm) carbonized carbon fibers, wherein "about" as used in this context only means plus or minus 0.25 inch (0.64 cm). A second vibratory feed ramp, which is vibrated by a second vibration generator, may transfer boron carbide powder to the annular cavity of the mold. The targeted fiber volume following compression of the fibrous layers by a compression board molding is 40% fiber volume, wherein "about" as used in this context only means plus or minus 10% fiber volume. Transferring of the carbon short fibers and of the boron carbide powder to the mold is coordinated to achieve 40% by volume carbon fiber and 28% by volume boron carbide powder, wherein "about" as used in this context only means plus or minus 10% by volume. Fibrous layers of about 150 grams per square meter of carbon fiber and about 145 grams per square meter of boron carbide powder are formed in the cavity of the mold, wherein "about" as used in this context only means plus or minus 20 grams per square meter. The closed perforated mold is first vacuum infiltrated with a phenolic resin and subsequently compression molded to cure the resin. The carbon composite is carbonized at about 1000° C. (1832° F.) in an inert atmosphere (i.e., under nitrogen or argon gas), wherein "about" as used in this context only means plus or minus 500° C. (900° F.). Subsequently, the composite structure is subjected to silicon melt in which a mixture of silicon, phenolic resin, and carbon black is applied to the composite structure comprising boron carbide and melted to about 1450° C. (2642° F.), wherein "about" as used in this context only means plus or minus 500° C. (900° F.).

Benefits and other advantages have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, and any elements that may cause any benefit or advantage to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element is intended to invoke 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An apparatus for forming a composite structure, comprising:
   a turntable;
   a base layer coupled to the turntable that is annular in shape and configured to rotate about an axis of rotation via the turntable;
   a vibratory feed ramp configured to transfer carbon short fibers to the base layer from an inner diameter area of the base layer to an outer diameter area of the base layer;
   a supplemental vibratory feed ramp configured to transfer carbon short fibers to the outer diameter area of the base layer, such that the outer diameter area of the base layer receives additional carbon short fibers relative to the inner diameter area of the base layer;
   a vibration generator coupled to the vibratory feed ramp, wherein the vibration generator is configured to generate vibrations to vibrate the vibratory feed ramp; and
   a supplemental vibration generator coupled to the supplemental vibratory feed ramp, wherein the supplemental vibration generator is configured to generate vibrations to vibrate the supplemental vibratory feed ramp.

2. An apparatus for forming a composite structure, comprising:
   a turntable;
   a base layer coupled to the turntable that is annular in shape and configured to rotate about an axis of rotation via the turntable;
   a vibratory feed ramp configured to transfer carbon short fibers to the base layer;
   a vibration generator coupled to the vibratory feed ramp, wherein the vibration generator is configured to generate vibrations to vibrate the vibratory feed ramp; and
   a first loader configured to transfer the carbon short fibers comprised therein onto the vibratory feed ramp, wherein the first loader comprises a loader hole comprising a first dimension and a second dimension, wherein the first dimension is larger than the second dimension, and the first dimension is disposed proximate an outer edge of the vibratory feed ramp such that, during operation of the apparatus, the outer diameter area of the base layer proximate the outer edge of the vibratory feed ramp receives additional carbon short fibers relative to the inner diameter area of the base layer.

\* \* \* \* \*